(12) United States Patent
Imel

(10) Patent No.: US 12,261,625 B2
(45) Date of Patent: Mar. 25, 2025

(54) SINGLE ERROR CORRECT DOUBLE ERROR DETECT (SECDED) ERROR CODING WITH BURST ERROR DETECTION CAPABILITY

(71) Applicant: Rambus Inc., San Jose, CA (US)

(72) Inventor: Michael Thomas Imel, Beaverton, OR (US)

(73) Assignee: Rambus Inc., San Jose, CA (US)

( * ) Notice: Subject to any disclaimer, the term of this patent is extended or adjusted under 35 U.S.C. 154(b) by 503 days.

(21) Appl. No.: 17/548,176

(22) Filed: Dec. 10, 2021

(65) Prior Publication Data

US 2022/0190846 A1   Jun. 16, 2022

Related U.S. Application Data

(60) Provisional application No. 63/158,291, filed on Mar. 8, 2021, provisional application No. 63/125,311, filed on Dec. 14, 2020.

(51) Int. Cl.
*H03M 13/11* (2006.01)
*H03M 13/19* (2006.01)

(52) U.S. Cl.
CPC ....... *H03M 13/1174* (2013.01); *H03M 13/19* (2013.01)

(58) Field of Classification Search
CPC ............. H03M 13/1174; H03M 13/19; H03M 13/036; H03M 13/17
See application file for complete search history.

(56) References Cited

U.S. PATENT DOCUMENTS 5,856,987 A * 1/1999 Holman ............... H03M 13/151
714/752
8,745,465 B1 * 6/2014 Aligave ................. G11C 29/42
714/762

(Continued)

OTHER PUBLICATIONS

Dao, Tich T., "Sec-Ded Nonbinary Code for Fault-Tolerant Byte-Organized Memory Implemented with Quaternary Logic", IEEE Transactions on Computers, vol. C-30, No. 9, Sep. 1981, pp. 662-666. 5 pages.

(Continued)

*Primary Examiner* — Mark D Featherstone
*Assistant Examiner* — Rong Tang
(74) *Attorney, Agent, or Firm* — Lance Kreisman; Peninsula Patent Group

(57) ABSTRACT

An integrated circuit (IC) device is disclosed. The IC device includes an error encoder to receive a word of k bits and to encode the word using a G-matrix to generate an encoded word of n bits. The n bits include the k bits and n-k check bits. The G matrix is based on a parity check matrix defining a single error correct, double error detect, and burst error detect (SECDEDBED) code. An error decoder receives the encoded word and applies the parity check matrix to the encoded word. The parity check matrix is configured to generate a syndrome from the encoded word. The syndrome being used to detect a random double bit error, a random single bit error, and a burst error of between two and m bits within m adjacent bits of an m-bit subset of the data word starting from an m-bit boundary of the word of k bits, and where $m < n-k$.

18 Claims, 4 Drawing Sheets

(56) References Cited

U.S. PATENT DOCUMENTS

| | | | | |
|---|---|---|---|---|
| 2003/0023930 A1* | 1/2003 | Fujiwara | ............... | H03M 13/17 |
| | | | | 714/788 |
| 2006/0265636 A1 | 11/2006 | Hummler | | |
| 2008/0215953 A1* | 9/2008 | Deierling | .............. | H03M 13/17 |
| | | | | 714/759 |
| 2021/0124711 A1* | 4/2021 | Ansari | ................ | G06F 11/0772 |

OTHER PUBLICATIONS

Hsiao, M.Y., "A Class of Optimal Minimum Odd-weight-column SEC-DED Codes", IBM Journal of Research and Development 14.4 (1970): 395-401, Jul. 1970, 7 pages.

* cited by examiner

FIG. 5

```
localparam P0_COEFF  = 256'hffffffff_ffffffff_ffffffff_ffffffe0_00000000_00000000_00000000_00000000;
localparam P1_COEFF  = 256'hffffffff_ffff8000_ffffffff_ffff8000_00000000_ffffffff_ffffffff_f0000000;
localparam P2_COEFF  = 256'hfffc0000_00007fff_fffc0000_00007fff_fffc0000_0fffffff_ffffc000_0fffffff;
localparam P3_COEFF  = 256'hfc003ffc_00007ff8_00007ff8_fe000003f_fffb0000_0fff0fff_0fff0fff_0003fff0;
localparam P4_COEFF  = 256'hc3c03803_fc007807_f8007f80_0ffe001e_01fe003f_c007ff80_0ff00ff_c003ff00;
localparam P5_COEFF  = 256'h22352703_83e04707_07e0707c_0f81f811_c1c1f038_3e07c07e_0e0f01f0_3f83e0fe;
localparam P6_COEFF  = 256'h11261680_631c64c4_c61c0c63_8c71c788_31318e26_31c63871_c98cf18e_387318f1;
localparam P7_COEFF  = 256'h80850dd3_529b36b6_b5924212_6a6db641_08084995_2935b649_204acd6d_b648974a;
localparam P8_COEFF  = 256'h80810a08a_0ad28028_674b2949_534b6d05_24a52500_8da96d25_b521a849_6d224e20;
localparam P9_COEFF  = 256'haa11d418_1d671bc3_a101825f_859c3f60_80014641_d6f6270e_c563f093_e76e9c10;
localparam P10_COEFF = 256'h5d6a0030_b064a961_319d69a2_61930665_0e2e306b_06cb16ec_d096cf1a_16dc60d0;
localparam P11_COEFF = 256'h0010028_be109810_14709590_0842b180_28989c2_e088895a_3a547ed7_893d77a3;
localparam P12_COEFF = 256'hc4753ca14_67cf80ff_1ae18c41_b61c78a2_104ed9e8_01077c495_b211220_0ffd870e;
localparam P13_COEFF = 256'h4844840e7_08250100_1a0e12ac_d9a78faa_fec2a78d_5b180b9a_f3992702_c1f42044;
localparam P14_COEFF = 256'h00081145_c1bb4608_48f6e235_f032d0e2_5b104256_3c0073b3_78a202e5_f98d7baf;
localparam P15_COEFF = 256'h00a4e90c_04088018_6024959e_36ec4bfc_c7771e90_c2788d8e7_446c1c3c_5a928942;
```

502

506

504

| TABLE 5-1 | | |
|---|---|---|
| HEX | BINARY | XOR |
| 0 | 0000 | 0 |
| 0 | 0000 | 0 |
| 0 | 0000 | 0 |
| f | 1111 | 0 |
| 0 | 0000 | 0 |
| e | 1110 | 1 |
| 1 | 0001 | 1 |
| d | 1101 | 1 |
| b | 1011 | 1 |
| 0 | 0000 | 0 |
| d | 1101 | 1 |
| 3 | 0011 | 0 |
| e | 1110 | 1 |
| 4 | 0100 | 1 |
| f | 1111 | 0 |
| 2 | 0010 | 0 |

SINGLE ERROR CORRECT DOUBLE ERROR DETECT (SECDED) ERROR CODING WITH BURST ERROR DETECTION CAPABILITY

CROSS-REFERENCE TO RELATED APPLICATIONS

This application is a Non-Provisional that claims priority to U.S. Provisional Application No. 63/125,311 filed Dec. 14, 2020, entitled SEC/DED ERROR CODING WITH BURST ERROR DETECTION CAPABILITY, and U.S. Provisional Application No. 63/158,291, filed Mar. 8, 2021, entitled SINGLE ERROR CORRECT DOUBLE ERROR DETECT (SECDED) ERROR CODING WITH BURST ERROR DETECTION CAPABILITY, both of which are incorporated herein by reference in their entirety.

TECHNICAL FIELD

The disclosure herein relates to error detection and correction (EDC) codes, and related methods, systems and devices that employ such codes.

BRIEF DESCRIPTION OF THE DRAWINGS

Embodiments of the disclosure are illustrated by way of example, and not by way of limitation, in the figures of the accompanying drawings and in which like reference numerals refer to similar elements and in which:

FIG. 5 illustrates one embodiment of a generator matrix G based on the parity matrix generated by the method steps shown in FIG. 4.

DETAILED DESCRIPTION

Embodiments of error-coded signaling methods, systems and associated integrated circuit devices are disclosed herein. One embodiment of an integrated circuit (IC) device described herein includes an error encoder to receive a word of k bits and to encode the word using a G-matrix to generate an encoded word of n bits. The n bits include the k bits and n-k check bits. The G matrix is based on a parity check matrix defining a single error correct, double error detect, and burst error detect (SECDEDBED) code. An error decoder receives the encoded word and applies the parity check matrix to the k bits of the encoded word. The parity check matrix is configured to generate a syndrome from the encoded word. The syndrome being used to detect a random double bit error, a random single bit error, and a burst error (SECDEDBED) of between two and m bits within m adjacent bits of an m-bit subset of the data word starting from any m-bit boundary of the word of k bits, and where m<n-k. By incorporating a burst error detection capability into an extended SECDED code, significantly more errors may be detected during operation of a given device, thereby improving the robustness and accuracy of the error code.

Figure 1:
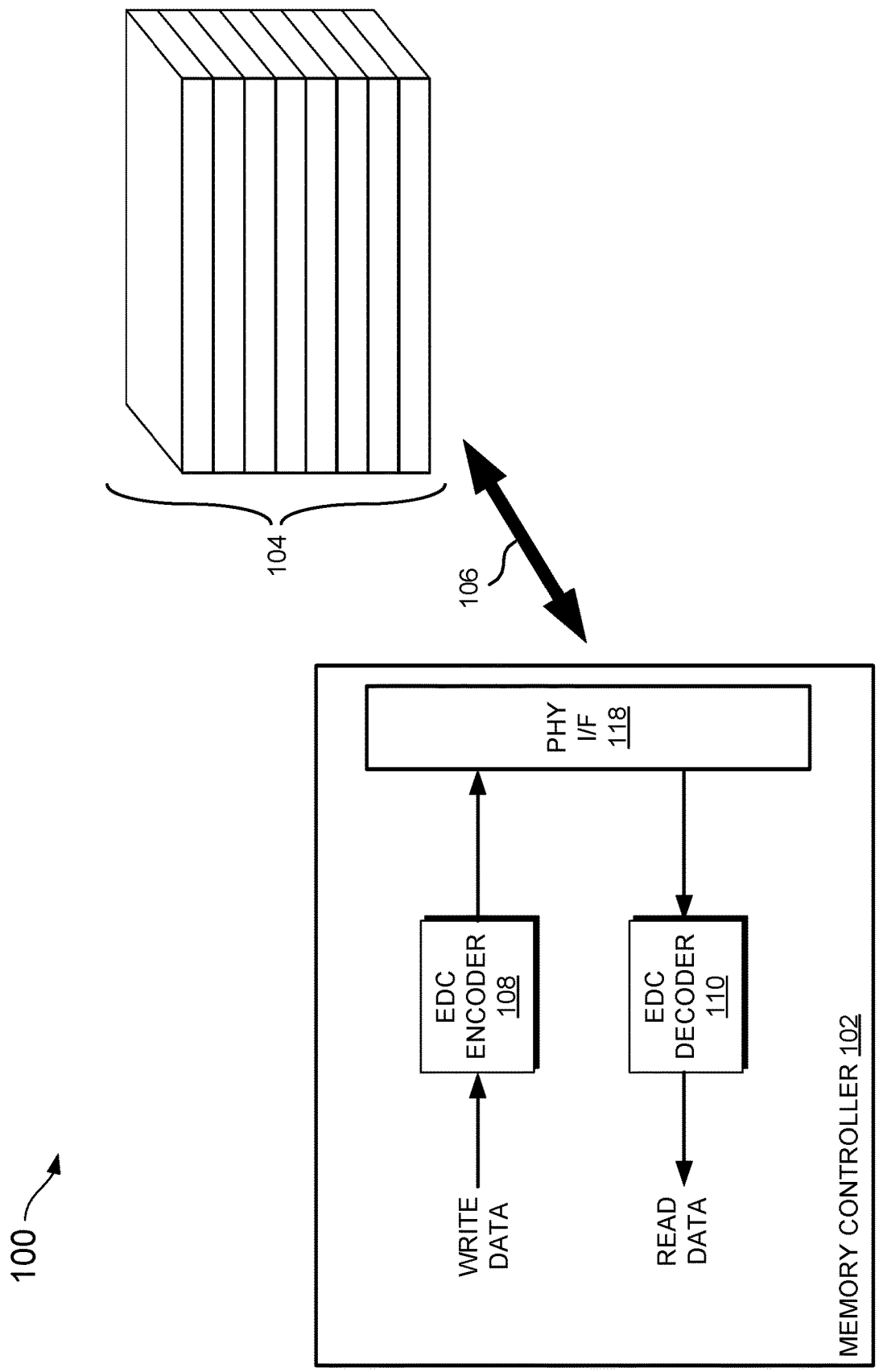
FIG. 1 illustrates one embodiment of a memory system that employs a memory controller and a high-bandwidth memory (HBM) device.

Referring now to FIG. 1, one embodiment of a chip-to-chip signaling architecture, generally designated 100, includes a first integrated circuit (IC) device 102 coupled to a second IC device 104 via a bus 106. For one specific embodiment, the first IC device 102 is in the form of an IC memory controller chip while the second IC device 104 is in the form of a high-bandwidth memory (HBM) device. For memory system embodiments, the memory controller is generally configured to direct data transfers between itself and the memory device 104, and may include, e.g., a discrete memory controller separate from a requestor integrated circuit (IC), or any IC that controls a memory device, and could be any type of system-on-chip (SoC) device. For some embodiments, the first IC device 102 and the second IC device 104 may take the form of network devices interconnected via one or more network links.

As noted above, for one embodiment, the second IC device 104 takes the form of a high-bandwidth memory (HBM) device such as one consistent with one of several standardized high-width DRAM architectures, such as High Bandwidth Memory (HBM), Wide I/O, Hybrid Memory Cube, and so forth. Such devices generally incorporate a wide data transfer interface, such as, for example, two-hundred-seventy-two paths for data and auxiliary information.

With continued reference to FIG. 1, one embodiment of the first IC device 102 employs a write data path that includes error detection/correction code (EDC) encoder circuitry 108 that encodes write data in accordance with a unique single error correct, double error detect and burst error detect (SECDEDBED) code, more fully described below. A read data path includes EDC decoder circuitry 110 to carry out EDC decoding of received read data in accordance with the SECDEDBED code. A physical (PHY) interface 112 couples the write data path EDC encoder 108 and the read data path EDC decoder 110 to the memory device 104.

Figure 2:
FIG. 2 illustrates further detail for one embodiment of the EDC encoder of FIG. 1.

FIG. 2 illustrates further detail for one embodiment of the write path EDC encoder circuitry 108 of FIG. 1. The circuitry generally includes an ECC generator 202 that employs logic circuitry corresponding to a Hamming code generator matrix G (not shown). The encoder receives input write data words "WRITE DATA" of k bits and encodes the k bits such that n-k parity bits are generated and appended to each data word. Depending on the application, the k bits may define a parallel data word or a serial data word. The parity bits generated by the EDC encoder 202 are generally passed along and interspersed with the original k bits of the data word as an encoded write data word "ENCODE WRITE DATA" for transmission to the memory device 104 along the bus 106. The generator matrix G construction is generally of the format used by single error correct, double error detect (SECDED) Hamming codes, but as more fully described below, configured in a manner such that the code also employs a burst error detect (BED) capability, thus resulting in the above-noted single error correct, double error detect and burst error detect (SECDEDBED) code.

Figure 3:
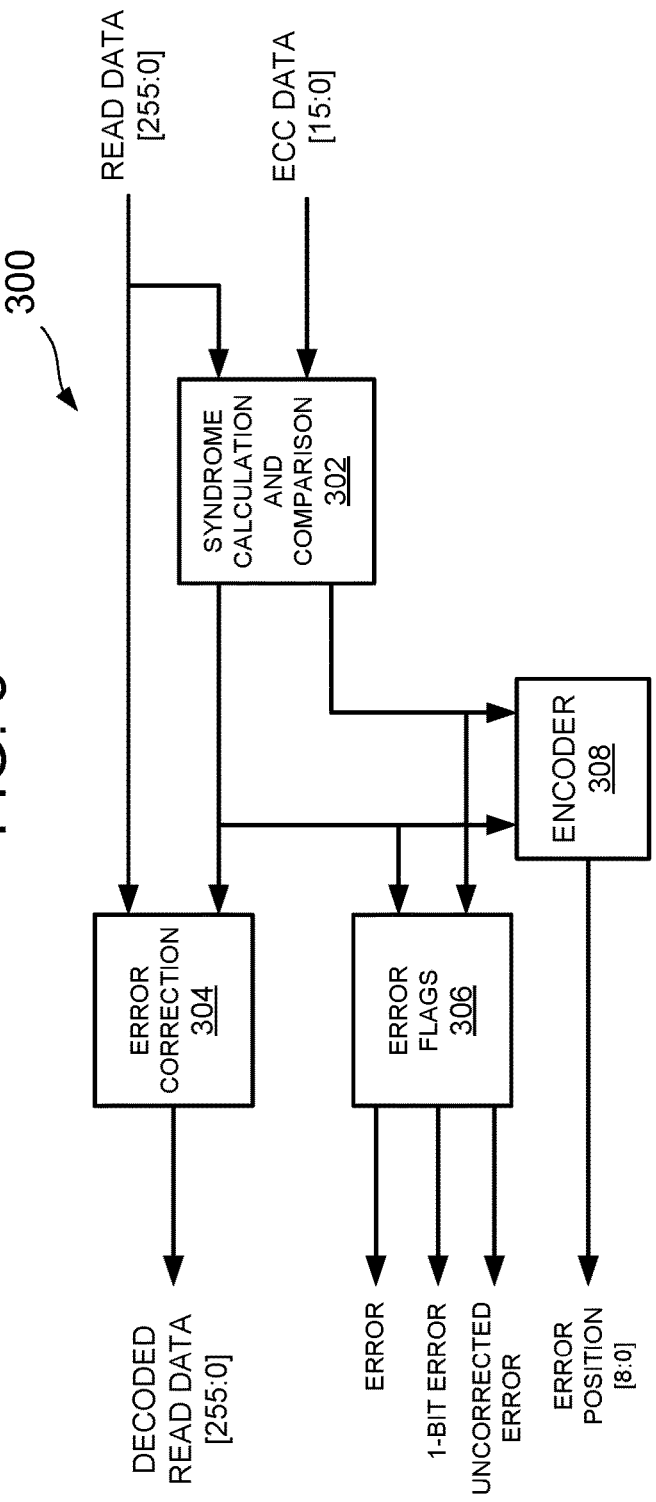
FIG. 3 illustrates further detail for one embodiment of the EDC decoder of FIG. 1.

Referring now to FIG. 3, one embodiment of the read data path EDC decoder circuitry 110 (FIG. 1), generally designated 300, includes syndrome calculation and comparison circuitry 302 that includes an input interface to receive read data "READ DATA" and the interspersed parity check bits "ECC DATA." The syndrome calculation and comparison circuitry 302 then encodes the received read data to generate a second set of parity check bits, and then compares the syndromes generated from the received parity check bits to those generated from the second set of parity check bits. If the syndromes match, and are zero, then no errors are identified. If the comparison circuitry detects a non-matching condition, then an error is detected. The read data and error syndrome information is then passed to an error correction module 304. If the error is a single-bit error, then the error correction module 304 uses the error syndrome to identify the bit location of the error so that the bit value can be "flipped" from the error value to the correct value, and the resulting data fed to an output as decoded read data. The data word and parity bits are also passed to an encoder circuit 308 that identifies the bit position that incurred the error. An error flags circuit 306 also receives the data word and parity information to generate one from a selection of flags that may indicate 1) whether an error occurred; 2) whether it was a one-bit error; and 3) whether the error(s) was uncorrected.

Generally speaking, the SECDEDBED code disclosed herein is defined in the generator matrix G (noted above) that is specifically constructed in an optimized way to minimize the probability of silent data corruption (SDC), reduce the number of gates employed in the coder/decoder, and correspondingly reduce power consumption in the EDC encoder/decoder circuitry. As used herein, the notion of "burst error detection" generally corresponds with an ability to detect at least two random bit errors and up to m bit errors within an aligned sub-group of m bits within a given word. One specific example of a burst would be an aligned set of eight consecutive bits within a given word of, for example 256 bits. Having a burst error detection capability in such an example would result in the ability to detect all random multiple errors within the group of eight bits (between two and eight random bit errors).

As noted above, the SECDEDBED code disclosed herein takes the form of a Hamming code. Generally speaking, Hamming codes represent a family of linear error-correcting codes that can protect a word of n data bits using k parity bits. A Hamming code is often described by the use of a matrix, called the Hamming (H) matrix, that is an (n-k) by n matrix which defines which data bits are used to combine with each check bit for generating an error syndrome. As noted above, typical extended Hamming codes can correct a single bit error at any location in a data word and detect up to two random bit errors in the word. For such SECDED codes, the Hamming distance is equal to four, and the minimum number of parity check bits required corresponds to the relationship:

$$\log_2(n)+2(n\text{-}k).$$

In some circumstances, however, a resulting error syndrome may inaccurately report a miscorrection in the form of silent data corruption (SDC).

For one embodiment, the SECDEDBED code described herein is configured to minimize SDC by employing additional parity bits over the minimum number of parity bits needed for SECDED capability. In using additional parity bits, however, the number of available codes that could potentially be incorporated into the new SECDEDBED code increases significantly. In order to optimize the selection of candidate codes that provide the least risk of SDC while providing for the additional burst error functionality, the available codes are constrained and identified in a unique way. The construction process generally takes place during a digital design flow, when the specific circuitry to be employed in the IC chip is determined. The parity check matrix is defined in a hardware description language (HDL) such as Verilog, where electronic design automation (EDA) tools are able to process the matrix into digital gates, resulting in circuitry employed by the ECC encoder and decoder to perform the matrix mathematical operations consistent with Hamming code error processing.

Figure 4:
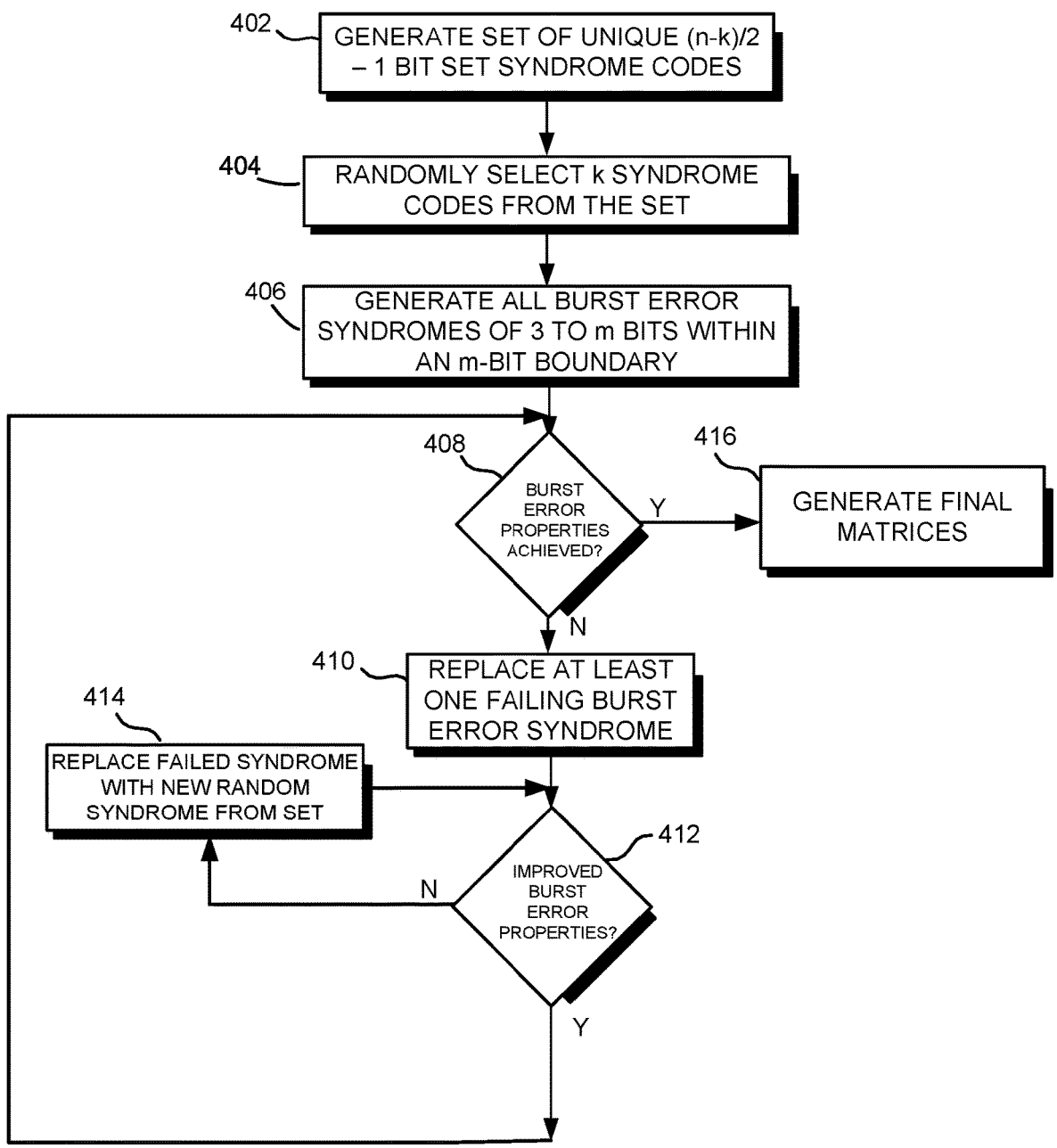
FIG. 4 illustrates a flowchart of steps for generating a parity matrix used in the EDC encoder and decoder of FIG. 1.

FIG. 4 illustrates a flowchart of steps for one specific embodiment of a method that may be performed to optimally construct a parity matrix that extends a SECDED code to provide burst error detection capability. The parity matrix takes the form of (n-k) rows, where each row corresponds to a parity check bit, and k columns, with each column corresponding to a bit position within a data word of k-bits in length. The collection of bits within a column position is referred to herein as a "syndrome code." The notation for n thus represents the data word and the check bits, collectively. As one specific example, a data word of 256 bits (k=256) is used with 16 checkbits, such that n is equal to 272, and n-k=16. With the understanding that the minimum number of checkbits to accomplish extended SECDED functionality is 10, the use of 16 parity check bits increases the number of candidate syndrome codes by thousands. Yet only 256 such syndrome codes will be employed in the parity check matrix and identified using the method shown in FIG. 4.

Further referring to FIG. 4, the parity matrix construction method begins by generating all possible unique syndrome codes of an odd weighting, at 402, in accordance with the following relationship:

$$(n\text{-}k)/2\text{-}1.$$

Thus, for each column of the parity matrix, and each row value within that column, an even value (such as a logic "0") for the location is considered an "even" weighting, while an "odd" value (such as a logic "1"). The relationship thus defines a specific weighting, or summed value for all of the bit positions of an error syndrome column. For one specific embodiment, a 7-bit weighting is employed. Thus, for such an embodiment, only syndrome codes (columns) where 7 of 16 possible column bit positions equals a logic "1" may be employed. Other embodiments may use odd weightings of 5, or of 3, or a combination of the 3, 5, and 7 weightings.

Further referring to FIG. 4, once the constrained odd-weighted syndrome codes are generated, the method, at 404, randomly selects a sub-set of k syndrome codes to populate all of the columns of the matrix. Using the randomly selected set, all burst error syndromes representing errors between 2 to m bits (for an m-bit burst sequence) within an m-bit boundary are generated, at 406. Further, XOR'ed results of two or more syndrome codes may be checked against a single-bit code, with the XORed result potentially being a candidate syndrome code. The set of possible burst error syndromes is then checked against legal correcting syndromes, at 408, in an effort to determine if the desired burst error properties have been achieved. If a given syndrome prevents achievement of the desired burst error properties, and satisfies at least one of several failing conditions, then it is replaced at 410. The failing condition criteria may include, for example:

1) The resulting syndrome matches any 1-bit error syndrome of the original sub-set of k syndrome codes;
2) The resulting syndrome has only a 1-bit set;
3) The resulting syndrome is equal to 0 (indicating no error).

With continued reference to FIG. 4, following replacement of the failed syndrome code, a further determination of the desired burst error properties is carried out, at 412. If no improvement is detected, then another failed error syndrome is replaced, at 414, to form a loop with the determination step at 412. Once the burst error properties begin to converge in an improving manner, then the method reverts back to a further determination of whether all desired burst error properties have been achieved, at 408. The process iterates through the determination steps and the syndrome code replacement steps until all burst error properties are achieved. At step 416, the parity matrix is then used as the basis to generate a generator matrix G, used to encode the data word, and a Hamming matrix H, used to decode the encoded data word.

For some embodiments, the parity matrix construction method described above may be applied at selected m-bit start boundaries set either by serial transmission boundaries or by storage error correcting boundaries.

FIG. 5 illustrates one example of a generator matrix G specified in Verilog format for a (272,256) SECDEDBED code. The matrix employs 16 rows, such as at 502, each corresponding to a parity check bit, and 64 hexadecimal-coded data columns 504. Each column shows which data bits are included into an XOR tree for each row's parity check bit calculation. A least-significant bit column, at 506, is shown with the complete syndrome code sequence highlighted in phantom. Table 5-1 shows that the syndrome code corresponds to a weighting of 7, due to an XORing of the decimal equivalent of each hexadecimal value in the column. The XOR output column at 506 indicates the (uncorrectable) syndrome that one would get if only data bits d3, d2, 1d1, and d0 were all flipped (a 4-bit burst error) on a returning read: 16'b0011_0101_1110_ 0000 (syndrome shown in the order of from checkbit 15 to checkbit 0).

In operation, the logic circuitry corresponding to the constructed parity matrix is employed within the ECC encoder circuitry 202 of FIG. 2, and the ECC decoder circuitry 300 of FIG. 3 to carry out error detection and correction operations between the first IC device 102 and the second IC device 104.

As noted above, for some embodiments, the first IC chip 102 and the second IC chip 104 may be interconnected via a networking architecture involving transfers of relatively large data words. For such applications, the constructed parity matrix is generally known at both ends of the channel in order for a partner device to properly decode the encoded data words.

In other embodiments, the EDC encoder and decoder circuitry may be configurable, thus providing a first set of functional characteristics for operation in a first mode, and a second set of functional characteristics for operating in a second mode. For instance, in some applications, a given data word may be organized as a parallel word of k bit width. In such an application, a corresponding operating mode for the EDC encoder/decoder circuitry could be enabled via a register bit, or the like, which could select one of multiple logic circuits generated during the parity matrix construction process to provide the SECDEDBED functionality in a parallel word context. A second mode of operation could be selected, for example, when the data words are of a serial format.

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

I claim:

1. An integrated circuit (IC) device, comprising:
an error encoder to receive a data word of k bits from a sequester circuit and to encode the data word using circuitry representing a G-matrix to generate an encoded word of n bits, the n bits including the k bits and a-k check bits, wherein the circuitry representing the G-matrix is based on circuitry representing a parity check matrix, the circuitry representing the parity check matrix to define a single error correct, double error detect, and burst error detect (SECDEDBED) code;
transmit circuitry to transmit the encoded data word to a second IC device;
an error decoder to receive the encoded word from the second IC device as a received encoded word and to apply the circuitry representing the parity check matrix to the encoded word, the circuitry representing the parity check matrix configured to generate a received data syndrome from the received encoded word, the received data syndrome used in a comparison process that compares the received data syndrome to a transmitted data syndrome, the comparison process to detect a random double bit error, a random single bit error, and a burst error of between two and m bits within m adjacent bits of an m-bit subset of the data word starting from an m-bit boundary of the data word of k bits, wherein m<n–k;
transfer circuitry to transfer the decoded data word to the requestor circuit; and
wherein the circuitry representing the parity check matrix is configured to constrain all possible unique syndrome codes for coding the data word to a reduced-set of candidate syndrome codes that are determined during a semiconductor fabrication process via a search method, the search method comprising:
generating a set of unique odd bit set syndrome codes comprising bit set weighting values from 3 to (n–k)/2–1;
selecting k syndrome codes from the set;
generating burst error syndromes of between 2 and m bits within a boundary of m adjacent bits; and
determining failing burst error syndromes and replacing the failing burst error syndromes with replacement syndromes until a burst error detection probability reaches a predetermined threshold.

2. The IC device of claim 1, wherein:
the parity check matrix is configured, in response to detecting the burst error, to generate a burst error syndrome indicating detection of the burst error;
wherein the burst error syndrome is generated based on a combination of multiple single-bit error syndromes.

3. The IC device of claim 1, wherein the determining failing burst error syndromes comprises at least one of:
identifying burst error syndromes that match any single-bit error syndrome;
identifying burst error syndromes of 1-bit set; or
identifying burst error syndromes that equal zero.

4. The IC device of claim 1, wherein the generating the set of unique odd bit set syndrome codes having bit set weighting values from 3 to (n–k)/2–1 comprises:
selecting unique odd bit set syndrome codes of a same weighting value.

5. The IC device of claim 4, wherein the generating the set of unique odd bit set syndrome codes comprising bit set weighting values from 3 to (n–k)/2–1 comprises:
selecting unique odd bit set syndrome codes of multiple weighting values.

6. The IC device of claim 1, wherein the search method is applied at selected m-bit start boundaries set either by serial transmission boundaries or by storage error correcting boundaries.

7. The IC device of claim 1, embodied as an IC memory controller.

8. The IC device of claim 1, embodied as a network device.

9. The IC device of claim 1, wherein the SECDEDBED code comprises a (272, 256) Hamming code.

10. A method of operation in an integrated circuit (IC) device, the method comprising:
receiving an encoded word of n bits from a second IC device, the n bits including k data bits and n-k check bits;
decoding the encoded word with an error decoder comprising circuitry representing an H-matrix that is based on circuitry representing a parity check matrix, the circuitry representing the parity check matrix defining a single error correct, double error detect, and burst error detect (SECDEDBED) code used to encode the encoded word, the decoding including applying the circuitry representing the parity check matrix to the encoded word to generate a received data syndrome from the received encoded word, using the received data syndrome in a comparison process that compares the received data syndrome to a transmitted data syndrome, the comparison process for detecting a random double bit error, a random single bit error, and a burst error of between two and m bits within m adjacent bits of an m-bit subset of a data word corresponding to the encoded word starting from an m-bit boundary of the k data bits, wherein m<n–k;
transferring the decoded data word to a requestor circuit; and
wherein the circuitry representing the parity check matrix is generated to constrain all possible unique syndrome codes for coding the data word to a reduced-set of candidate syndrome codes that are determined during a semiconductor fabrication process via a search method, the search method comprising:
generating a set of unique odd bit set syndrome codes comprising bit set weighting values from 3 to (n–10)/2–1;
selecting k syndrome codes from the set;
generating burst error syndromes of between 2 and m bits within a boundary of m adjacent bits; and
determining failing burst error syndromes and replacing the failing burst error syndromes with replacement syndromes until a burst error detection probability reaches a predetermined threshold.

11. The method of claim 10, wherein in response to detecting the burst error of between 2 and m bits, the method further comprising:
generating a burst error syndrome based on a combination of multiple single-bit error syndromes.

12. The method of claim 10, wherein the determining failing burst error syndromes comprises at least one of:
identifying burst error syndromes that match any single-bit error syndrome;
identifying burst error syndromes of 1-bit set; or
identifying burst error syndromes that equal zero.

13. The method of claim 10, wherein the generating the set of unique odd bit set syndrome codes having bit set weighting values from 3 to (n–k)/2–1 comprises:
    selecting unique odd bit set syndrome codes of a same weighting value.

14. The method of claim 10, wherein the generating the set of unique odd bit set syndrome codes having bit set weighting values from 3 to (n–k)/2–1 comprises:
    selecting unique odd bit set syndrome codes of multiple weighting values.

15. The method of claim 10, wherein the search method is applied at selected m-bit start boundaries set either by serial transmission boundaries or by storage error correcting boundaries.

16. An integrated circuit (IC) memory controller, comprising:
    an error encoder to receive a data word of k bits from a requestor circuit and to encode the data word using circuitry representing a G-matrix to generate an encoded word of n bits, the n bits including the k bits and n-k check bits, wherein the circuitry representing the G-matrix is based on circuitry representing a parity check matrix, the circuitry representing the parity check matrix to define a single error correct, double error detect, and burst error detect (SECDEDBED) code;
    interface circuitry to transmit the encoded word of n bits as write data to a memory device;
    an error decoder to receive the encoded word from the memory device as read data and to apply the circuitry representing the parity check matrix to the encoded word, the circuitry representing the parity check matrix configured to generate a read data syndrome from the received encoded word, the read data syndrome used in a comparison process that compares the received data syndrome to a transmitted data syndrome, the comparison process to detect a random double bit error, a random single bit error, and a burst error of between two and m bits within m adjacent bits of an m-bit subset of the data word starting from an m-bit boundary of the data word of k bits, wherein m<n–k;
    transferring the decoded data word to the requestor circuit; and
    wherein the circuitry representing the parity check matrix is configured to constrain all possible unique syndrome codes for coding the data word to a reduced-set of candidate syndrome codes that are determined during a semiconductor fabrication process via a search method, the search method comprising:
    generating a set of unique odd bit set syndrome codes comprising bit set weighting values from 3 to (n–k)/2–1;
    selecting k syndrome codes from the set;
    generating burst error syndromes of between 2 and m bits within a boundary of m adjacent bits; and
    determining failing burst error syndromes and replacing the failing burst error syndromes with replacement syndromes until a burst error detection, probability reaches a predetermined threshold.

17. The IC memory controller of claim 16, embodied as a High-Bandwidth Memory (HBM) memory controller.

18. The IC memory controller of claim 17, wherein the SECDEDBED code comprises a (272, 256) Hamming code.

* * * * *